United States Patent
Ando et al.

(10) Patent No.: US 8,367,496 B2
(45) Date of Patent: Feb. 5, 2013

(54) SCAVANGING METAL STACK FOR A HIGH-K GATE DIELECTRIC

(75) Inventors: Takashi Ando, Tuckahoe, NY (US); Changhwan Choi, Yorktown Heights, NY (US); Martin M. Frank, Dobbs Ferry, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/099,790

(22) Filed: May 3, 2011

(65) Prior Publication Data
US 2011/0207280 A1 Aug. 25, 2011

Related U.S. Application Data

(62) Division of application No. 12/487,248, filed on Jun. 18, 2009, now Pat. No. 7,989,902.

(51) Int. Cl.
*H01L 21/8238* (2006.01)
(52) U.S. Cl. .......... 438/216; 438/261; 438/287
(58) Field of Classification Search .......... 438/216, 438/261, 287
See application file for complete search history.

(56) References Cited

U.S. PATENT DOCUMENTS
2004/0185198 A1  9/2004  Sisson et al.
2010/0187643 A1  7/2010  Chudzik et al.

FOREIGN PATENT DOCUMENTS
CN  101421839 A  4/2009

OTHER PUBLICATIONS

Hubbard et al., "Thermodynamic stability of binary oxides in contact with silicon", J. Mater. Res. vol. 11, No. 11, Nov. 1996, pp. 2757-2776.
Letter from IBM China which indicates that the date of the issued Office Action is Oct. 26, 2011.

*Primary Examiner* — Thien F Tran
(74) *Attorney, Agent, or Firm* — Scully, Scott, Murphy & Presser, P.C.; Vazken Alexanian (57) ABSTRACT

A stack of a high-k gate dielectric and a metal gate structure includes a lower metal layer, a scavenging metal layer, and an upper metal layer. The scavenging metal layer meets the following two criteria 1) a metal (M) for which the Gibbs free energy change of the reaction $Si + 2/y\, M_xO_y \rightarrow 2x/y\, M + SiO_2$ is positive 2) a metal that has a more negative Gibbs free energy per oxygen atom for formation of oxide than the material of the lower metal layer and the material of the upper metal layer. The scavenging metal layer meeting these criteria captures oxygen atoms as the oxygen atoms diffuse through the gate electrode toward the high-k gate dielectric. In addition, the scavenging metal layer remotely reduces the thickness of a silicon oxide interfacial layer underneath the high-k dielectric. As a result, the equivalent oxide thickness (EOT) of the total gate dielectric is reduced and the field effect transistor maintains a constant threshold voltage even after high temperature processes during CMOS integration.

20 Claims, 4 Drawing Sheets

SCAVANGING METAL STACK FOR A HIGH-K GATE DIELECTRIC

CROSS REFERENCE TO RELATED APPLICATION

This application is a divisional of U.S. patent application Ser. No. 12/487,248, filed Jun. 18, 2009 the entire content and disclosure of which is incorporated herein by reference.

FIELD OF THE INVENTION

The present invention generally relates to semiconductor devices, and particularly to a metal gate stack included in an electrode over a high-k gate dielectric, and methods of manufacturing the same.

BACKGROUND

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below the thickness of 1.1 nm for the silicon oxide gate dielectric.

High-k gate dielectric provides a way of scaling down the thickness of the gate dielectric without an excessive increase in the gate leakage current. However, high-k gate dielectric materials are prone to a change in the effective oxide thickness (EOT) because high-k gate dielectric materials react with oxygen that diffuses through the gate electrode or gate spacers. Regrowth of a silicon oxide interfacial layer between a silicon substrate and the high-k gate dielectric during high-temperature processing steps is a major obstacle to successful effective oxide thickness scaling. Particularly, typical stacks of a high-k gate dielectric and a metal gate is known to be susceptible to a high temperature anneal in an oxygen ambient. Such a high temperature anneal in oxygen ambient results in regrowth of the silicon oxide interfacial layer and produces instability of the threshold voltage of field effect transistors.

SUMMARY

The present invention provides a stack of a high-k gate dielectric and a metal gate structure includes a lower metal layer, a scavenging metal layer, and an upper metal layer. The scavenging metal layer meets the following two criteria 1) a metal (M) for which the Gibbs free energy change of the reaction $Si+2/y\ M_xO_y \rightarrow 2x/y\ M+SiO_2$ is positive 2) a metal that has a more negative Gibbs free energy per oxygen atom for formation of oxide than the material of the lower metal layer and the material of the upper metal layer. The scavenging metal layer meeting these criteria captures oxygen atoms as the oxygen atoms diffuse through the gate electrode toward the high-k gate dielectric. In addition, the scavenging metal layer remotely reduces the thickness of a silicon oxide interfacial layer underneath the high-k dielectric. As a result, the equivalent oxide thickness (EOT) of the total gate dielectric is reduced and the field effect transistor maintains a constant threshold voltage even after high temperature processes during CMOS integration.

According to an aspect of the present invention, a semiconductor structure is provided, which includes: a semiconductor substrate comprising a semiconductor material; a gate dielectric comprising a high dielectric constant (high-k) dielectric layer having a dielectric constant greater than 7.5 and located on the semiconductor substrate; and a gate electrode abutting the gate dielectric and including a lower metal layer abutting the gate dielectric, a scavenging metal layer abutting the lower metal layer, and an upper metal layer abutting the scavenging metal layer, wherein the scavenging metal layer includes a metal (M) for which the Gibbs free energy change of the reaction, $Si+2/y\ M_xO_y \rightarrow 2x/y\ M+SiO_2$, is positive, and wherein Gibbs free energy per oxygen atom for formation of an oxide for the metal is equal to or more negative than Gibbs free energy per oxygen atom for formation of an oxide of a first elemental metal within a first metallic compound in the lower metal layer and is equal to or more negative than Gibbs free energy per oxygen atom for formation of an oxide of a second elemental metal within a second metallic compound in the upper metal layer.

According to another aspect of the present invention, a method of forming a semiconductor structure is provided, which includes: forming a gate dielectric including a high dielectric constant (high-k) dielectric layer having a dielectric constant greater than 7.5 on a semiconductor substrate; forming a stack including, from bottom to top, a lower metal layer, a scavenging metal layer, and an upper metal layer, wherein Gibbs free energy per oxygen atom for formation of an oxide for the scavenging metal layer is equal to or more negative than Gibbs free energy per oxygen atom for formation of an oxide of an first elemental metal within a first metallic compound for the lower metal layer and Gibbs free energy per oxygen atom for formation of an oxide of a second elemental metal within a second metallic compound for the upper metal layer; and forming a gate electrode and a gate dielectric, wherein the gate electrode is formed by patterning the stack, and wherein the gate dielectric includes a portion of the high-k dielectric layer.

BRIEF DESCRIPTION

DETAILED DESCRIPTION

As stated above, the present invention relates to a metal gate stack included in an electrode over a high-k gate dielectric, and methods of manufacturing the same, which are now described in detail with accompanying figures. It is noted that like and corresponding elements are referred to by like reference numerals. The drawings are not drawn to scale.

Figure 1:
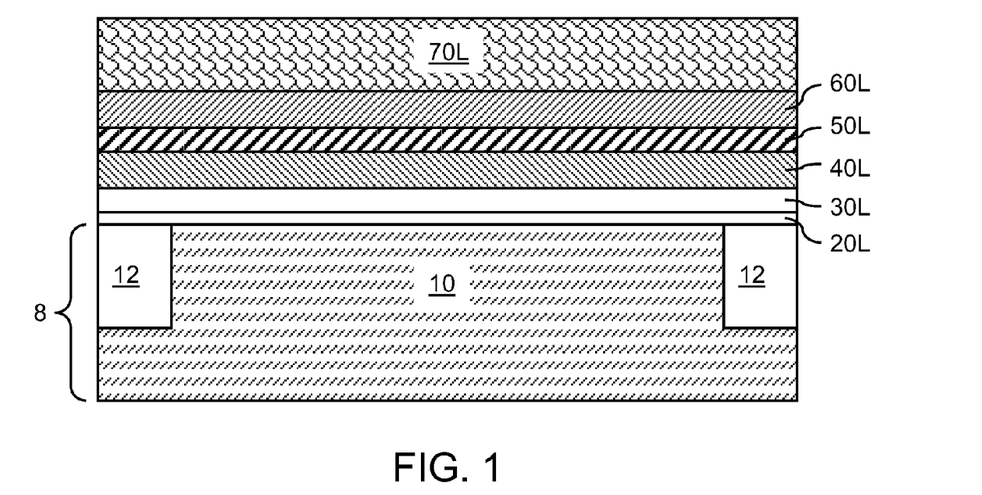
FIG. 1 is a vertical cross-sectional view of a first exemplary semiconductor structure after formation of a high-k dielectric layer, a lower metal layer, a scavenger metal layer, an upper metal layer, and a polycrystalline semiconductor layer according to the present invention.

Referring to FIG. 1, an exemplary semiconductor structure according to the present invention comprises a semiconductor substrate 8 and a stack of material layers formed thereupon. The semiconductor substrate 8 contains a substrate semiconductor layer 10 and shallow trench isolation structures 12. The substrate semiconductor layer 10 has a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material of the substrate semiconductor layer 10 comprises silicon, and more typically, the semiconductor material of the substrate semiconductor layer 10 is silicon.

In case the semiconductor material of the substrate semiconductor layer 10 is a single crystalline silicon-containing semiconductor material, the single crystalline silicon-containing semiconductor material is preferably selected from single crystalline silicon, a single crystalline silicon carbon alloy, a single crystalline silicon germanium alloy, and a single crystalline silicon germanium carbon alloy.

The semiconductor material of the substrate semiconductor layer 10 may be appropriately doped either with p-type dopant atoms or with n-type dopant atoms. The dopant concentration of the substrate semiconductor layer 10, and may be from $1.0 \times 10^{15}/cm^3$ to $1.0 \times 10^{19}/cm^3$, and typically from $1.0 \times 10^{16}/cm^3$ to $3.0 \times 10^{18}/cm^3$, although lesser and greater dopant concentrations are contemplated herein also. Preferably, the substrate semiconductor layer 10 is single crystalline. The semiconductor substrate 8 may be a bulk substrate, a semiconductor-on-insulator (SOI) substrate, or a hybrid substrate. The semiconductor substrate 8 may, or may not, have a built-in stress in the substrate semiconductor layer 10. While the present invention is described with a bulk substrate, implementation of the present invention on an SOI substrate or on a hybrid substrate is explicitly contemplated herein. The shallow trench isolation structure 12 comprises a dielectric material such as silicon oxide or silicon nitride, and is formed by methods well known in the art.

An unpatterned chemical oxide layer 20L may be formed on the exposed semiconductor surface of the substrate semiconductor layer 10. An unpatterned high dielectric constant (high-k) dielectric layer 30L is formed directly on the top surface of the unpatterned chemical oxide layer 20L. Even in the case the unpatterned chemical oxide layer 20L is not formed, the deposition of the unpatterned high dielectric constant (high-k) dielectric layer 30L and subsequent thermal processes lead to the formation of pre-existing interfacial layer between the substrate semiconductor layer 10 and the unpatterned high dielectric constant (high-k) dielectric layer 30L. The unpatterned chemical oxide layer 20L may be formed by treatment of exposed semiconductor surfaces with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at 65° C. Alternately, the chemical oxide layer can also be formed by treating the HF-last semiconductor surface in ozonated aqueous solutions, with the ozone concentration usually varying from, but not limited to: 2 parts per million (ppm) to 40 ppm. The unpatterned chemical oxide layer 20L helps minimize mobility degradation in the substrate semiconductor layer 10 due to high-k dielectric material in the unpatterned high-k dielectric layer 30L. However, the thickness of the unpatterned chemical oxide layer 20L is thicker than necessary and increases the effective oxide thickness (EOT) of a composite dielectric stack, which includes the unpatterned chemical oxide layer 20L and the unpatterned high-k dielectric layer 30L. The scalability of EOT is severely limited by the thickness of the unpatterned chemical oxide layer 20L. In case the substrate semiconductor layer is a silicon layer, the unpatterned chemical oxide layer 20L is a silicon oxide layer. Typically, the thickness of the unpatterned chemical oxide layer 20L is from 0.1 nm to 0.4 nm, although lesser and greater thicknesses are also contemplated herein.

A high dielectric constant (high-k) dielectric layer 30L is formed on a top surface of the semiconductor substrate 8. The unpatterned high-k dielectric layer 30L comprises a high dielectric constant (high-k) material comprising a dielectric metal oxide and having a dielectric constant that is greater than the dielectric constant of silicon nitride of 7.5. The unpatterned high-k dielectric layer 30L may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the unpatterned high-k dielectric layer 30L may be from 1 nm to 10 nm, and preferably from 1.5 nm to 3 nm. The unpatterned high-k dielectric layer 30L may have an effective oxide thickness (EOT) on the order of, or less than, 1 nm.

An unpatterned lower metal layer 40L is deposited directly on the top surface of the unpatterned high-k dielectric layer 30L. The unpatterned lower metal layer 40L may be formed, for example, by chemical vapor deposition (CVD), physical vapor deposition (PVD), or atomic layer deposition (ALD).

The material of the unpatterned lower metal layer 40L is herein referred to as a "first metallic compound" which may be a conductive transition metal nitride or a conductive transition metal carbide. The first metallic compound is a compound of a first metallic element selected from transition metals and a non-metallic element. If the non-metallic element is nitrogen, the first metallic compound is a transition metal nitride. If the non-metallic element is carbon, the first metallic compound is a transition metal carbide. For example, the first metallic compound may be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the unpatterned lower metal layer 40L may be from 1 nm to 10 nm, and preferably from 3 nm to 10 nm, although lesser and greater thicknesses are also contemplated herein.

An unpatterned scavenging metal layer 50L is deposited directly on the top surface of the unpatterned lower metal layer 40L. The unpatterned scavenging metal layer 50L may be formed, for example, by chemical vapor deposition (CVD), physical vapor deposition (PVD), or atomic layer deposition (ALD). Preferably, the first exemplary semiconductor structure is transferred from a processing chamber that deposits the unpatterned lower metal layer 40L to another processing chamber that deposits the unpatterned scavenging metal layer 50L without breaking vacuum to prevent formation of any interfacial layer by oxidation or introduction of oxygen into the unpatterned lower metal layer 40L.

The material of the unpatterned scavenging metal layer 50L "scavenges" impurity oxygen from neighboring metallic layers during subsequent processing. For the unpatterned scavenging metal layer 50L to effectively scavenge impurity oxygen in subsequent processing steps, it is necessary that introduction of oxygen into the unpatterned scavenging metal layer 50L is suppressed during the formation step. Further, it is necessary to select the material for the unpatterned scavenging metal layer 50L so that the material of the unpatterned scavenging metal layer 50L effectively scavenges impurity oxygen atoms from the unpatterned lower metal layer 40L and an unpatterned upper metal layer 60L to be subsequently formed.

The unpatterned scavenging metal layer 50L may include a metal in an elemental form. Typical elemental metals that may be selected for the unpatterned scavenging metal layer 50L include, but are not limited to, Al, Be, Mg, Ca, Sr, Ba, Sc, Y, La, Ti, Zr, Hf, Dy, Lu, Er, Pr, and Ce. In one embodiment, the unpatterned scavenging metal layer 50 consists of at least one alkaline earth metal. In another embodiment, the unpatterned scavenging metal layer 50 consists of at least one transition metal. In yet another embodiment, the unpatterned scavenging metal layer 50 consists of a mixture of at least one alkaline earth metal and at least one transition metal. Preferably, the thickness of the unpatterned scavenging metal layer 50L may be from 0.1 nm to 3.0 nm, although lesser and greater thicknesses are also contemplated herein.

An unpatterned upper metal layer 60L is deposited directly on the top surface of the unpatterned scavenging metal layer 50L. The unpatterned upper metal layer 60L may be formed, for example, by chemical vapor deposition (CVD), physical vapor deposition (PVD), or atomic layer deposition (ALD). Preferably, the first exemplary semiconductor structure is transferred from the processing chamber that deposits the unpatterned scavenging metal layer 50L to a processing chamber that deposits the unpatterned upper metal layer 60L without breaking vacuum to prevent formation of any interfacial layer by oxidation or introduction of oxygen into the unpatterned scavenging metal layer 50L.

The material of the unpatterned upper metal layer 60L is herein referred to as a "second metallic compound" which may be a conductive transition metal nitride or a conductive transition metal carbide. The second metallic compound is a compound of a second metallic element selected from transition metals and a non-metallic element. If the non-metallic element is nitrogen, the second metallic compound is a transition metal nitride. If the non-metallic element is carbon, the second metallic compound is a transition metal carbide. For example, the second metallic compound may be selected from TiN, TiC, TaN, TaC, and a combination thereof. The thickness of the unpatterned upper metal layer 60L may be from lower from 1 nm to 100 nm, and preferably from 3 nm to 10 nm, although lesser and greater thicknesses are also contemplated herein.

In one case, the first metallic compound and the second metallic compound are the same material. In another case, the first metal compound and the second metal compound are different materials.

In one embodiment, the material for the unpatterned scavenging metal layer 50L is selected such that Gibbs free energy per oxygen atom for formation of an oxide for the unpatterned scavenging metal layer 50L is equal to or more negative than Gibbs free energy per oxygen atom for formation of an oxide of the first elemental metal within the first metallic compound for the unpatterned lower metal layer 40L. Further, the material for the unpatterned scavenging metal layer 50L is selected such that Gibbs free energy per oxygen atom for formation of an oxide for the unpatterned scavenging metal layer 50L is equal to or more negative than Gibbs free energy per oxygen atom for formation of an oxide of the second elemental metal within the second metallic compound for the unpatterned upper metal layer 60L.

For example, the first and second metallic compounds may be selected from TiN, TiC, TaN, TaC, and a combination thereof. The unpatterned scavenging metal layer 50L includes at least one of Al, Be, Mg, Ca, Sr, Ba, Sc, Y, La, Ti, Zr, Hf, Dy, Lu, Er, Pr, and Ce.

In another embodiment, the material for the unpatterned scavenging metal layer 50L is selected such that Gibbs free energy per oxygen atom for formation of an oxide for the unpatterned scavenging metal layer 50L is more negative than Gibbs free energy per oxygen atom for formation of an oxide of the first elemental metal within the first metallic compound for the unpatterned lower metal layer 40L. Further, the material for the unpatterned scavenging metal layer 50L is selected such that Gibbs free energy per oxygen atom for formation of an oxide for the unpatterned scavenging metal layer 50L is more negative than Gibbs free energy per oxygen atom for formation of an oxide of the second elemental metal within the second metallic compound for the unpatterned upper metal layer 60L.

In one illustrative example according to this embodiment, each of the first metallic compound and the second metallic compound may be selected from TaN, TaC, and a combination thereof. Because titanium (Ti) has a more negative Gibbs free energy per oxygen atom for formation of an oxide than tantalum (Ta), the unpatterned scavenging metal layer 50L may comprise a metal in an elemental form and selected from Al, Be, Mg, Ca, Sr, Ba, Sc, Y, La, Ti, Zr, Hf, Dy, Lu, Er, Pr, and Ce in this illustrative example.

In another illustrative example according to this embodiment, at least one of the first metallic compound and the second metallic compound may be selected from TiN, TiC, and a combination thereof. The unpatterned scavenging metal layer 50L may include a metal in an elemental form and selected from Al, Be, Mg, Ca, Sr, Ba, Sc, Y, La, Zr, Hf, Dy, Lu, Er, Pr, and Ce in this illustrative example.

In a preferred example, the first metallic compound of the unpatterned lower metal layer 40L and the second metallic compound of the unpatterned upper metal layer 60L are TiN and the unpatterned scavenging metal layer 50L is an aluminum layer including aluminum in elemental metal form.

Not necessarily but preferably, an unpatterned polycrystalline semiconductor layer 70L is deposited directly on the top surface of the unpatterned upper metal layer 60L, for example, by low pressure chemical vapor deposition (LPCVD), rapid thermal chemical vapor deposition (RTCVD), or plasma enhanced chemical vapor deposition (PECVD). The unpatterned polycrystalline semiconductor layer 70L may comprise polysilicon, a polycrystalline silicon germanium alloy, a polycrystalline silicon carbon alloy, or a polycrystalline silicon germanium carbon alloy. The unpatterned polycrystalline semiconductor layer 70L may be formed as a doped polycrystalline semiconductor layer through in-situ doping. Alternately, the unpatterned polycrystalline semiconductor layer 70L may be doped by ion implantation of dopant atoms after deposition of the unpatterned polycrystalline semiconductor layer 70L and prior to patterning of a gate electrode. Yet alternately, implantation of dopant ions may be performed on a remaining portion of the unpatterned polycrystalline semiconductor layer 70L after patterning of the gate electrode. The thickness of the unpatterned polycrystalline semiconductor layer 70L may be from 10 nm to 300 nm, and typically from 50 nm to 100 nm, although lesser and greater thicknesses are also contemplated herein. Embodiments in which the unpatterned polycrystalline semiconductor layer 70L is not formed and the stack of the unpatterned lower metal layer 40L, unpatterned scavenging metal layer 50L, and unpatterned upper metal layer 60L constitutes a gate electrode layer.

A photoresist layer (not shown) is applied to the top surface of the unpatterned polycrystalline semiconductor layer 70L and lithographically patterned to form a photoresist portion 77 (See FIG. 2), which has the shape of a gate electrode to be subsequently formed. The pattern in the photoresist portion 77 is transferred into the stack of the unpatterned polycrystalline semiconductor layer 70L, the unpatterned upper metal layer 60L, the unpatterned scavenging metal layer 50L, the unpatterned lower metal layer 40L, the unpatterned high-k dielectric layer 30L, and the unpatterned chemical oxide layer 20L. The pattern transfer may be effected by an anisotropic etch that employs the photoresist portion 77 as an etch mask.

Figure 2:
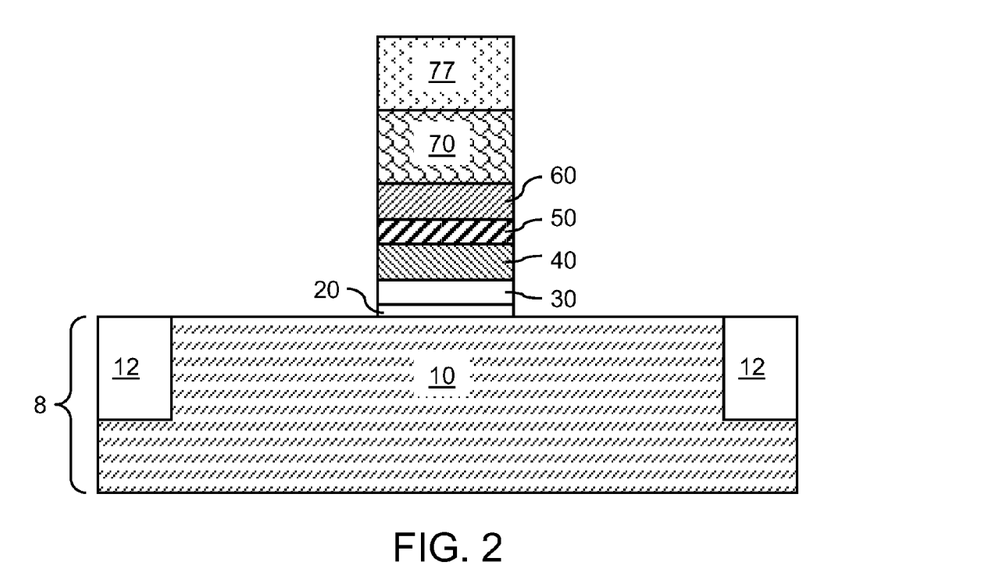
FIG. 2 is a vertical cross-sectional view of the first exemplary semiconductor structure after patterning of a gate dielectric and a gate electrode according to the present invention.

Referring to FIG. 2, the remaining portions of the unpatterned polycrystalline semiconductor layer 70L, the unpatterned upper metal layer 60L, the unpatterned scavenging metal layer 50L, the unpatterned lower metal layer 40L constitute a gate electrode, which include a polycrystalline semiconductor layer 70, an upper metal layer 60, a scavenging metal layer 50, and lower metal layer 40. The gate electrode (40, 50, 60, 70) is typically patterned as a line having a width, which is the width of the lower metal layer 40 as shown in FIG. 2 and is referred to as a "gate length." The gate length depends on the device characteristics and may be from the lithographically printable smallest dimension to 10 microns. Typically, the gate length is from 32 nm to 1 micron, although lesser and greater gate lengths are also contemplated herein.

The remaining portion of the unpatterned high-k dielectric layer 30L is herein referred to as a high-k dielectric layer 30, and the remaining portion of the unpatterned chemical oxide layer 20L is herein referred to as a chemical oxide layer 20. The high-k dielectric layer 30 and the chemical oxide layer 20 collectively constitute a gate dielectric (20, 30). Typically, the gate dielectric (20, 30) has an effective oxide thickness (EOT) less than 1.2 nm, and may have an EOT less than 1.0 nm. The photoresist portion 77 is subsequently removed, for example, by ashing.

The sidewalls of the gate electrode (40, 50, 60, 70) and the gate dielectric (20, 30) are typically substantially vertical, i.e., parallel to the surface normal of the exposed surface of the substrate semiconductor layer 10. Further, the sidewalls of the gate electrode (40, 50, 60, 70) and the gate dielectric (20, 30) are typically substantially vertically coincident with each other.

Figure 3:
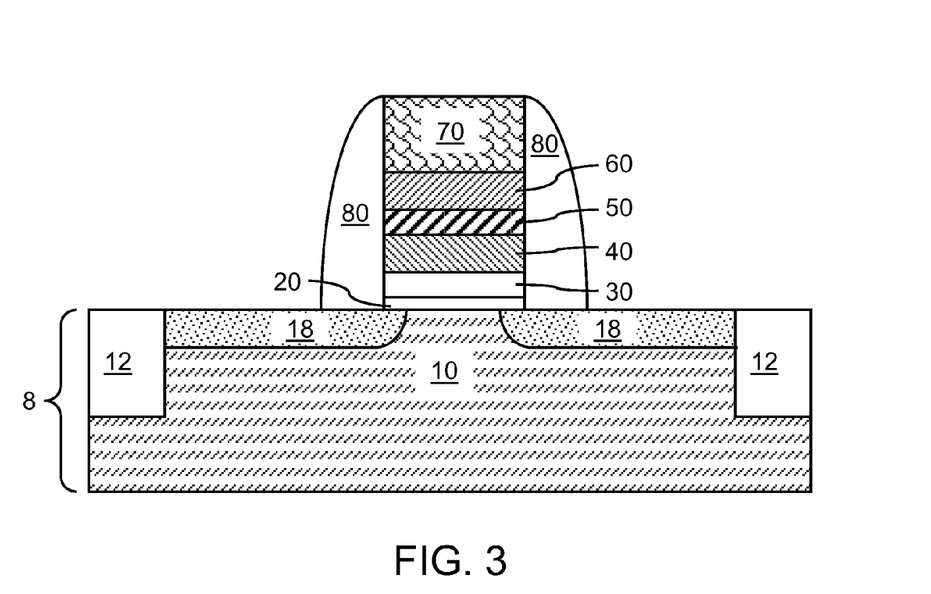
FIG. 3 is a vertical cross-sectional view of the first exemplary semiconductor structure after formation of a gate spacer and source and drain extension regions.

Referring to FIG. 3, source and drain extension regions 18 are formed by ion implantation that employs the gate electrode (40, 50, 60, 70) and the gate dielectric (20, 30) as an implantation mask. The source and drain extension regions 18 have a doping of the opposite conductivity type of the doping of the substrate semiconductor layer 10. For example, if the substrate semiconductor layer 10 has a p-type doping, the source and drain extension regions 18 have an n-type doping, and vice versa. The dopant concentration of the source and drain extension regions 18 may be from $1.0\times10^{19}/cm^3$ to $1.0\times10^{21}/cm^3$, although lesser and greater dopant concentrations are contemplated herein also. Each of the source and drain extension regions 18 abut peripheral portions of the gate dielectric (20, 30).

Optionally, a halo implantation may be performed at this step to introduce dopants of the same conductivity type as the doping of the substrate semiconductor layer 10 to volumes of the substrate semiconductor layer 10 located underneath peripheral portions of the gate electrode (40, 50, 60, 70) and the gate dielectric (20, 30).

A gate spacer 80 laterally abutting the sidewalls of the gate electrode (40, 50, 60, 70) and the sidewalls of the gate dielectric (20, 30) is formed, for example, by deposition of a conformal dielectric material layer followed by an anisotropic ion etching. The portion of the dielectric material layer that is formed directly on the sidewalls of the gate electrode (40, 50, 60, 70) and the gate dielectric (20, 30) remain after the anisotropic etch to constitute a gate spacer 80 that laterally surrounds the gate electrode (40, 50, 60, 70) and the gate dielectric (20, 30). Preferably, the gate spacer 80 includes an oxygen-impermeable material such as silicon nitride.

Figure 4:
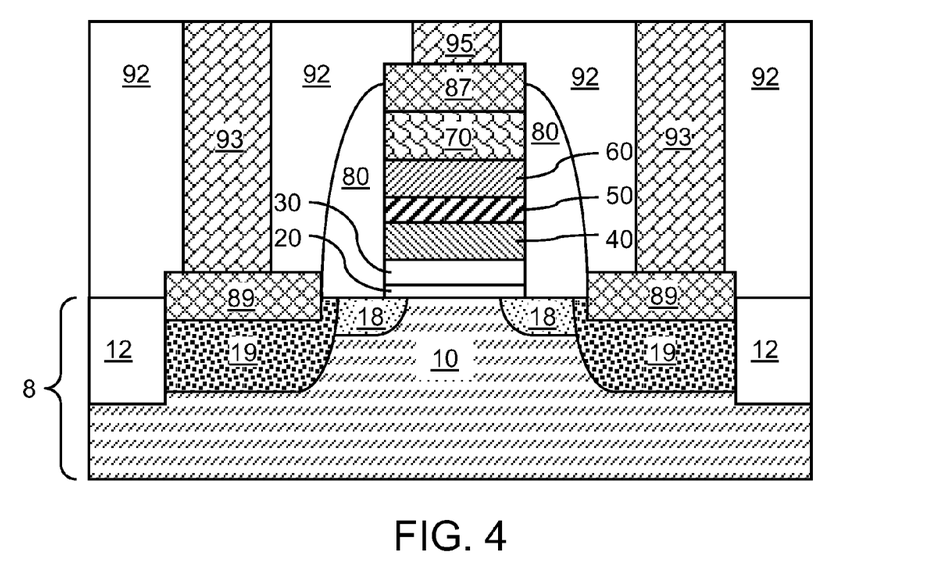
FIG. 4 is a vertical cross-sectional view of the first exemplary semiconductor structure after formation of silicide regions, a dielectric material layer, and contact vias.

Referring to FIG. 4, source and drain regions 19 are formed by ion implantation that employs the gate electrode (40, 50, 60, 70) and the gate spacer 80 as an implantation mask. The source and drain regions 19 have a doping of the same conductivity type as the doping of the source and drain extension regions 18. The dopant concentration of the source and drain regions 19 may be from $1.0\times10^{19}/cm^3$ to $1.0\times10^{21}/cm^3$, although lesser and greater dopant concentrations are contemplated herein also.

An activation anneal is thereafter performed to activate electrical dopants implanted within the source and drain extension regions 18 and the source and drain regions 19. Such an activation anneal is typically performed in an oxidizing ambient during which the compositional integrity of the high-k dielectric layer may be compromised in prior art semiconductor structures. In the present invention, however, the thickening of the chemical oxide layer 20, if present, is prevented in the exemplary semiconductor structure in FIG. 4 because the scavenging metal layer 50 consumes oxygen that diffused downward from the polycrystalline semiconductor layer 70. In case a chemical oxide layer 20 is absent in the exemplary structure of the present invention, formation of an interfacial semiconductor oxide layer between the substrate semiconductor layer 10 and the high-k dielectric layer 30 is prevented by the same mechanism. Therefore, the flat band voltage of the structure including the substrate semiconductor layer 10, the gate dielectric (20, 30), and the lower metal gate 40 is not affected during the activation anneal or in any other thermal processing step in an oxidizing ambient.

A metal layer (not shown) is formed over the entire exposed top surfaces of the exemplary semiconductor structure and reacted with exposed semiconductor materials to form various metal semiconductor alloy regions. The metal layer comprises a metal that reacts with the semiconductor material in the source and drain regions 19 and the polycrystalline semiconductor layer 70. Non-limiting exemplary materials for the metal layer include nickel, platinum, palladium, cobalt or a combination thereof. The formation of the metal layer may be effected by physical vapor deposition (PVD), chemical vapor deposition (CVD), or atomic layer deposition (ALD). The metal layer may be deposited in a conformal or non-conformal manner. Preferably, the metal deposition is substantially conformal.

The exposed semiconductor surfaces in direct contact with the metal layer are metallized by reacting with the metal in the metal layer during a metallization anneal. The metallization is effected by an anneal at a temperature from 350° C. to 550° C., which is typically performed in an inert gas atmosphere, e.g., He, Ar, $N_2$, or forming gas. Preferably, the anneal is performed at a temperature from 400° C. to 500° C. A continuous heating at a constant temperature or various ramping in temperature may be employed. The metallization may further be effected by an additional anneal at a temperature from 400° C. to 750° C., and preferably from 500° C. to 700° C. After the metallization process, unreacted portions of the metal layer, which are present over dielectric surfaces such as the gate spacer 80 and the shallow trench isolation structures 12, are removed selective to various metal semiconductor alloy portions by an etch, which may be a wet etch. A typical etchant for such a wet etch employs aqua regia.

The metallization forms source and drain metal semiconductor alloy regions 89 directly on each of the source and drain regions 19. Further, a gate metal semiconductor alloy region 87 is formed directly on the top surface of the polycrystalline semiconductor layer 70.

A dielectric material layer 92 is deposited over the entirety of the top surfaces of the exemplary semiconductor structure. The dielectric material layer 60 comprises a dielectric material such as silicon oxide, silicon nitride, silicon oxynitride, or a combination thereof.

Preferably, the dielectric material layer 60 includes a mobile ion barrier layer (not shown). The mobile ion barrier layer typically comprises an impervious dielectric material such as silicon nitride and directly contacts the various metal semiconductor alloy regions (89, 87). The dielectric material layer 60 may additionally include, for example, a spin-on-glass and/or chemical vapor deposition (CVD) oxide such as undoped silicate glass (USG), borosilicate glass (BSG), phosphosilicate glass (PSG), fluorosilicate glass (FSG), borophosphosilicate glass (BPSG), or a combination thereof. Alternately, the dielectric material layer 60 may comprise a low-k dielectric material having a dielectric constant less than 3.9 (the dielectric constant of silicon oxide), and preferably less than 2.5. Exemplary low-k dielectric materials include organosilicate glass (OSG) and SiLK™.

layer 70 from passing into the lower metal layer 40 because the oxygen atoms are scavenged by the scavenging metal layer 50. Therefore, the field effect transistor of the present invention provides a superior reliability against oxygen diffusion that may degrade or alter the device parameters of the field effect transistor.

Figure 5:
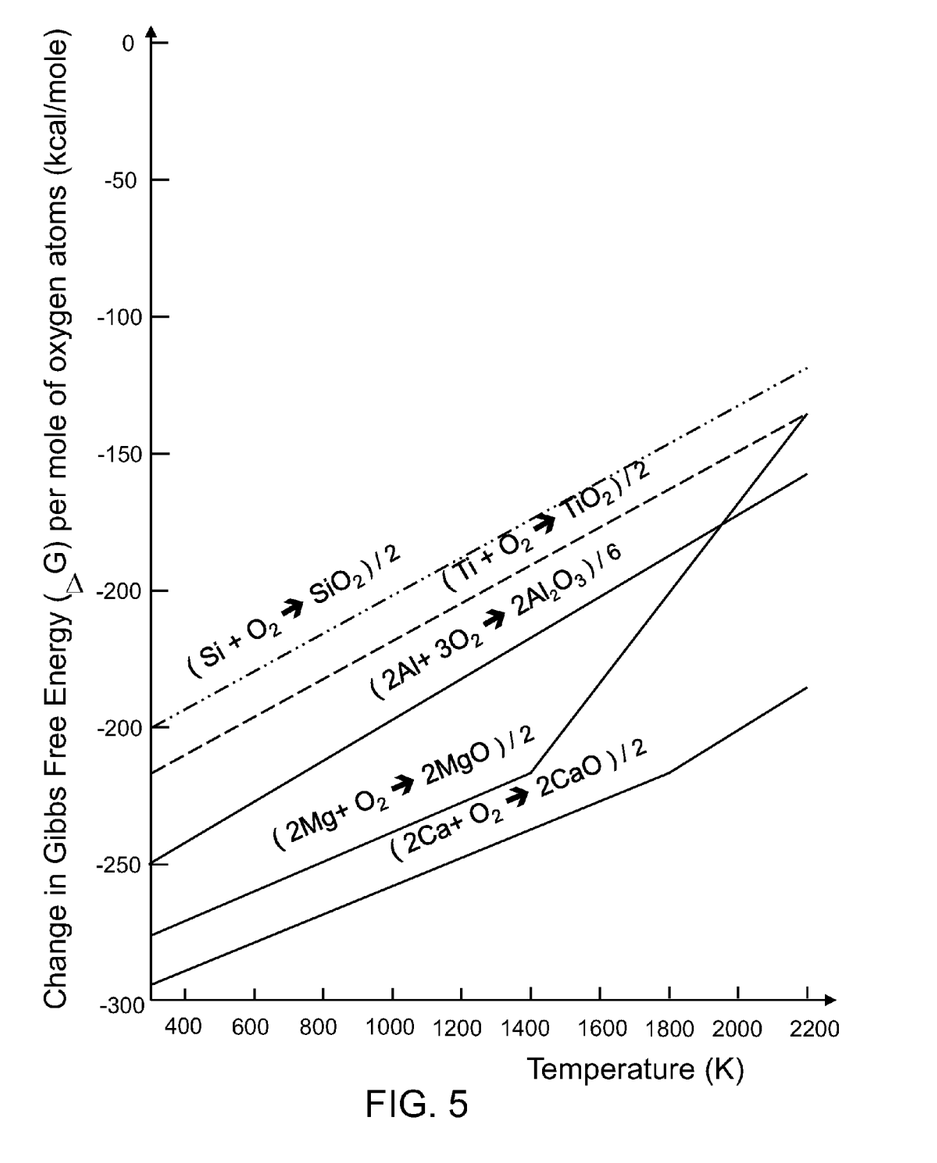
FIG. 5 is a graph showing the amount of change in Gibbs free energy during oxidation of various metals.

Referring to FIG. 5, the amount of change in Gibbs free energy per oxygen atom during oxidation of various metals is shown within a temperature range from 300 K to 2,200 K. When a reaction having a more negative change in Gibbs free energy per oxygen atom competes with another reaction having a less negative change in Gibbs free energy per oxygen atom for a limited supply of reactants, the reaction with the more negative change in Gibbs free energy dominates the reaction and consumes a prevailing majority of the available reactants. In the case of oxidation reactions within the gate electrode (40, 50, 60, 70; See FIG. 4) during a high temperature anneal in an oxidizing ambient, oxygen atoms or oxygen molecules that diffuse through the polycrystalline semiconductor layer 70 (See FIG. 4) and the upper metal layer 60 (See FIG. 4) are the reactants that are supplied in a limited quantity. Within the temperature range of the activation anneal, which is typically performed at about 1,000° C., or about 1,300 K, elemental metals such as Al, Be, Mg, Ca, Sr, Ba, Sc, Y, La, Zr, Hf, Dy, Lu, Er, Pr, and Ce have more negative changes in Gibbs free energy relative to typical transition metals such as Ti and Ta. Therefore, elemental metals such as Al, Be, Mg, Ca, Sr, Ba, Sc, Y, La, Zr, Hf, Dy, Lu, Er, Pr, and Ce effectively function as the scavenging material for the scavenging metal layer 50 (See FIG. 4).

The Gibbs free energy changes for some selected elemental metal atoms by reaction $Si + 2/y\, M_xO_y \rightarrow 2x/y\, M + SiO_2$ are given in Table 1.

TABLE 1

The Gibbs free energy change at 1000K for the reaction $Si + 2/y\, M_xO_y \rightarrow 2x/y\, M + SiO_2$, wherein M is the elemental metal.

| Oxide | $Li_2O$ | $Na_2O$ | $K_2O$ | BeO | MgO | CaO | SrO | BaO |
|---|---|---|---|---|---|---|---|---|
| ΔG | +24.298 | −20.061 | −33.749 | +32.405 | +30.572 | +39.914 | +30.821 | +21.338 |
| Oxide | $Sc_2O_3$ | $Y_2O_3$ | $La_2O_3$ | $Ce_2O_3$ | $CeO_2$ | $Pr_2O_3$ | $PrO_2$ | $Nd_2O_3$ |
| ΔG | +123.11 | +116.82 | +98.470 | +104.95 | +36.209 | +105.76 | +13.559 | +101.69 |
| Oxide | $Sm_2O_3$ | EuO | $Eu_2O_3$ | $Gd_2O_3$ | $Tb_2O_3$ | $TbO_{1.72}$ | $Dy_2O_3$ | $Ho_2O_3$ |
| ΔG | +103.94 | +33.238 | +61.901 | +101.55 | +114.76 | +38.273 | +112.44 | +118.45 |
| Oxide | $Er_2O_3$ | $Tm_2O_3$ | $Yb_2O_3$ | $Lu_2O_3$ | $ThO_2$ | $UO_2$ | TiO | $Ti_2O_3$ |
| ΔG | +112.03 | +116.65 | +103.83 | +116.97 | +75.513 | +43.670 | +17.749 | +35.432 |
| Oxide | $TiO_2$ | $ZrO_2$ | $HfO_2$ | VO | $V_2O_3$ | $VO_2$ | NbO | $NbO_2$ |
| ΔG | +7.527 | +42.326 | +47.648 | −5.314 | −30.197 | −43.280 | −10.132 | −13.872 |
| Oxide | $Nb_2O_5$ | $Ta_2O_5$ | $Cr_2O_3$ | $MoO_2$ | $MoO_3$ | $WO_2$ | $WO_{2.72}$ | $WO_3$ |
| ΔG | −86.228 | −52.533 | −55.275 | −76.902 | −143.78 | −77.126 | −107.20 | −121.81 |
| Oxide | MnO | $Mn_3O_4$ | $Mn_2O_3$ | $TcO_2$ | $ReO_2$ | FeO | $Fe_3O_4$ | $Fe_2O_3$ |
| ΔG | −12.752 | −100.60 | −94.689 | −112.91 | −126.66 | −37.774 | −160.08 | −127.47 |
| Oxide | $RuO_2$ | $OsO_2$ | CoO | $Rh_2O_3$ | $IrO_2$ | NiO | PdO | $Cu_2O$ |
| ΔG | −142.27 | −147.25 | −48.041 | −235.15 | −159.47 | −51.377 | −86.066 | −64.284 |
| Oxide | CuO | ZnO | CdO | $Al_2O_3$ | $Ga_2O_3$ | $In_2O_3$ | $GeO_2$ | SnO |
| ΔG | −71.375 | −28.461 | −49.433 | +63.399 | −79.411 | −117.72 | −82.124 | −43.514 |
| Oxide | $SnO_2$ | PbO | $Pb_3O_4$ | $PbO_2$ | $SbO_2$ | $Bi_2O_3$ | $TeO_2$ | |
| ΔG | −84.977 | −59.249 | −269.62 | −155.79 | −110.52 | −191.85 | −140.95 | |

The dielectric material layer 60 is subsequently planarized to form a substantially planar top surface. Source and drain contact vias 93 and a gate contact via 95 are formed through the dielectric material layer 60 to provide electrical contact to the source and drain regions 19, respectively, and to the gate electrode (40, 50, 60, 70).

The exemplary semiconductor structure in FIG. 4 functions as a field effect transistor having a high-k gate dielectric and a metal gate. The presence of the scavenging metal layer 50 within the gate electrode (40, 50, 60, 70) prevents oxygen atoms that diffuse down the polycrystalline semiconductor Referring to FIG. 6, test data for capacitance as a function of the gate voltage is shown for three types of metal gate electrodes. A first curve 610 shows the capacitance for a reference gate electrode including an 8 nm thick TiN layer and a polycrystalline semiconductor layer formed directly thereupon according to the prior art. A second curve 620 shows the capacitance for an exemplary gate electrode according to the present invention that includes a stack, from bottom to top, of a 3.5 nm thick TiN layer as a lower metal layer, a 1.0 nm Ti layer as a scavenging metal layer, a 3.5 nm thick TiN layer an upper metal layer, and a polycrystalline semiconductor layer. A third curve 630 shows the capacitance for another exemplary gate electrode according to the present invention that includes a stack, from bottom to top, of a 3.5 nm thick TiN layer as a lower metal layer, a 1.0 nm Al layer as a scavenging metal layer, a 3.5 nm thick TiN layer an upper metal layer, and a polycrystalline semiconductor layer. A fourth curve 640 shows the capacitance for an counterexample gate electrode that was formed against the teaching of the instant invention by includes a stack, from bottom to top, of a 3.5 nm thick TiN layer as a lower metal layer, a 1.0 nm Ta layer as a scavenging metal layer, a 3.5 nm thick TiN layer an upper metal layer, and a polycrystalline semiconductor layer. Ta has less decrease in Gibbs free energy than Ti so that use of Ta as a scavenging material layer should be avoided if the lower metal layer and the upper metal layer include TiN according to the present invention. Thus, the structure of the counterexample gate electrode is not desirable. A $HfO_2$ layer was employed as a high-k dielectric layer, which was formed between a substrate semiconductor layer and each gate electrode. All four gate electrode structures were subjected to an activation anneal at a temperature about 1,000° C. in an oxidizing ambient.

Figure 6:
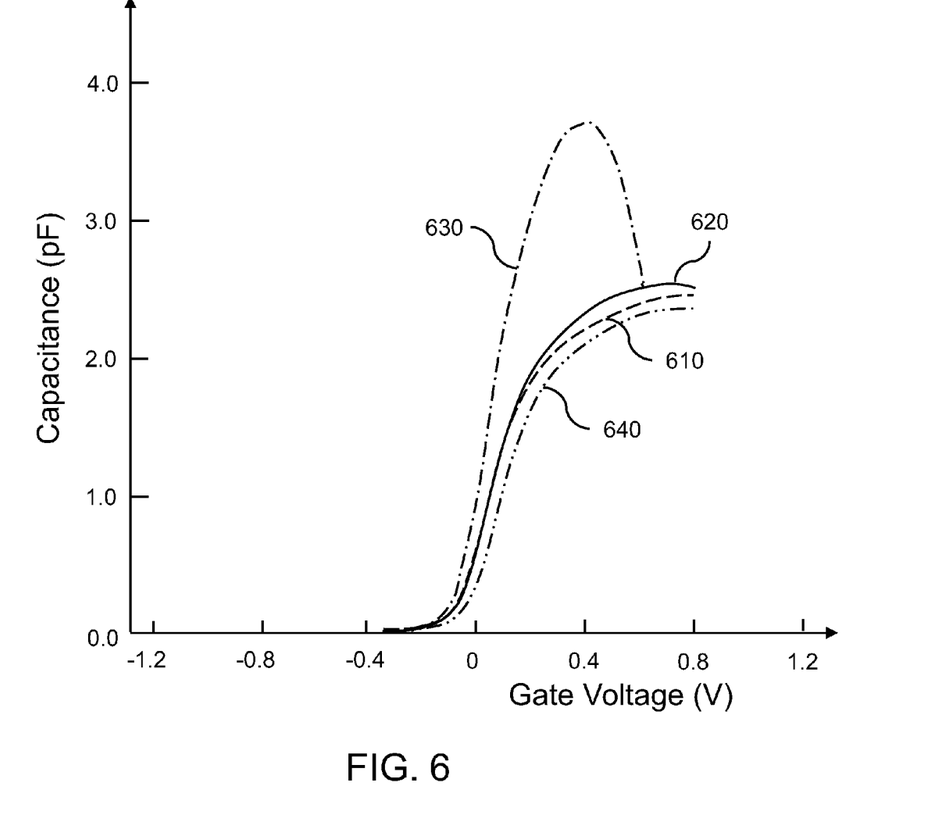
FIG. 6 is a graph showing capacitance as a function of the gate voltage for four types of metal gate electrodes.

Comparison of the four curves (610, 620, 630) show that the effective capacitance achieved by the gate stacks of the present invention, as demonstrated by the second and third curves (620, 630), is greater than the capacitance achieved by the reference gate stack, as demonstrated by the first curve 610. Thus, the effective oxide thickness (EOT) achieved by the gate stacks of the present invention is less than the EOT achieved by the reference gate stack, providing enhanced performance. In other words, use of the gate electrode of the present invention, which includes a lower metal layer, a scavenging layer, and an upper metal layer, resulted in reduction of EOT compared with a prior art reference structure that employs a single metal layer instead.

In contrast, the effective capacitance achieved by the counterexample gate stacks, as demonstrated by the fourth curve 640, is less than the capacitance achieved by the prior art gate stack, as demonstrated by the first curve 610. Thus, the effective oxide thickness (EOT) achieved by the counterexample gate stack is greater than the EOT achieved by the prior art gate stack, providing worse performance. In other words, use of the wrong type of material that is taught away from in the present invention for a scavenging layer resulted in increase of EOT compared with the prior art reference structure that employs a single metal layer instead. Thus, the importance of the selection of the material for the scavenging metal layer is underscored by the counterexample.

The scavenging metal layer 50 captures oxygen atoms from above and from below, i.e, the scavenging metal layer 50 captures oxygen atoms as the oxygen atoms diffuse through the polycrystalline semiconductor layer 70 and the upper metal layer 60 in the gate electrode toward the high-k gate dielectric 30. Because the scavenging metal layer is more prone to oxide formation than the lower metal layer 40 and the upper metal layer 50, the oxygen atoms are consumed within the scavenging metal layer 50 and the oxygen atoms do not reach the high-k gate dielectric 30. In addition, the scavenging metal layer 50 actively reduces the thickness of the chemical oxide layer 20 underneath the high-k dielectric 30 as additional oxygen atoms migrate toward the chemical oxide layer 20 from below or from the side of the chemical oxide layer 20. Such migrating oxygen atoms are captured by the scavenging metal layer 50 instead of being incorporated into the chemical oxide layer 20. Not only growth of the chemical oxide layer 20 underneath the high-k gate dielectric 30 is prevented, but the thickness of the chemical oxide layer 20 is reduced as a significant portion of the oxygen atoms in the chemical oxide layer 20 is consumed by the scavenging metal layer 50. Thus, the field effect transistor maintains a constant threshold voltage even after a high temperature anneal in oxygen ambient. By reducing and limiting the thickness of the thickness of the chemical oxide layer 20 than what is normally obtainable by conventional processing, the effective oxide thickness (EOT) of a composite gate dielectric stack, which includes the chemical oxide layer 20 and the high-k dielectric 30, is reduced, thereby enhancing the scalability of the composite gate dielectric stack and performance of the field effect transistor.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    forming a high dielectric constant (high-k) dielectric layer having a dielectric constant greater than 7.5 on a semiconductor substrate;
    forming a stack including, from bottom to top, a lower metal layer, a scavenging metal layer, and an upper metal layer, wherein said scavenging metal layer includes a metal (M) for which the Gibbs free energy change of a chemical reaction, in which a silicon atom combines with a metal oxide material including said metal and oxygen to form said metal in elemental form and silicon oxide, is positive, and wherein Gibbs free energy per oxygen atom for formation of an oxide for said metal is equal to or more negative than Gibbs free energy per oxygen atom for formation of an oxide of a first elemental metal within a first metallic compound in said lower metal layer and is equal to or more negative than Gibbs free energy per oxygen atom for formation of an oxide of a second elemental metal within a second metallic compound in said upper metal, wherein at least one of said first metallic compound and said second metallic compound is a conductive transition metal carbide; and
    forming a gate electrode and a gate dielectric, wherein said gate electrode is formed by patterning said stack, and wherein said gate dielectric includes a portion of said high-k dielectric layer.

2. The method of claim 1, wherein said scavenging metal layer has a thickness from 0.1 nm to 3.0 nm, wherein said lower metal layer has a thickness from 1 nm to 10 nm, and wherein said upper metal layer has a thickness from 1 nm to 100 nm.

3. The method of claim 1, wherein another of said first metallic compound and said second metallic compound is a conductive transition metal nitride or another conductive transition metal carbide.

4. The method of claim 3, wherein said scavenging metal layer is an aluminum layer.

5. The method of claim 1, wherein Gibbs free energy per oxygen atom for formation of an oxide for said scavenging metal layer is more negative than Gibbs free energy per oxygen atom for formation of an oxide of an first elemental metal within a first metallic compound for said lower metal layer and Gibbs free energy per oxygen atom for formation of an oxide of a second elemental metal within a second metallic compound for said upper metal layer.

6. The method of claim 1, wherein said high-k dielectric layer comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, wherein each value of x is independently from 0.5 to 3 and each value of y is independently from 0 to 2.

7. The method of claim 1, further comprising forming a doped polycrystalline semiconductor layer on said upper metal layer, wherein said gate electrode includes a portion of said doped polycrystalline semiconductor layer.

8. The method of claim 1, further comprising:
forming a dielectric spacer directly on sidewalls of said gate electrode, wherein said dielectric spacer comprises an oxygen-impermeable material;
forming a source region contacting a peripheral portion of said gate spacer in said semiconductor substrate; and
forming a drain region contacting another peripheral portion of said gate spacer in said semiconductor substrate.

9. The method of claim 1, wherein said scavenging metal layer comprises at least one alkaline earth metal.

10. The method of claim 9, wherein said scavenging metal layer consists of said at least one alkaline earth metal.

11. The method of claim 9, wherein said scavenging metal layer consists of said at least one alkaline earth metal and at least one transition metal.

12. A method of forming a semiconductor structure comprising:
forming a high dielectric constant (high-k) dielectric layer having a dielectric constant greater than 7.5 on a semiconductor substrate;
forming a stack including, from bottom to top, a lower metal layer, a scavenging metal layer, and an upper metal layer, wherein said scavenging metal layer includes a metal (M) for which the Gibbs free energy change of a chemical reaction, in which a silicon atom combines with a metal oxide material including said metal and oxygen to form said metal in elemental form and silicon oxide, is positive, wherein said scavenging metal layer comprises at least one alkaline earth metal, wherein Gibbs free energy per oxygen atom for formation of an oxide for said metal is equal to or more negative than Gibbs free energy per oxygen atom for formation of an oxide of a first elemental metal within a first metallic compound in said lower metal layer and is equal to or more negative than Gibbs free energy per oxygen atom for formation of an oxide of a second elemental metal within a second metallic compound in said upper metal; and
forming a gate electrode and a gate dielectric, wherein said gate electrode is formed by patterning said stack, and wherein said gate dielectric includes a portion of said high-k dielectric layer.

13. The method of claim 12, wherein said scavenging metal layer consists of said at least one alkaline earth metal.

14. The method of claim 12, wherein said scavenging metal layer consists of said at least one alkaline earth metal and at least one transition metal.

15. The method of claim 12, wherein at least one of said first metallic compound and said second metallic compound is a conductive transition metal carbide.

16. A method of forming a semiconductor structure comprising:
forming a high dielectric constant (high-k) dielectric layer having a dielectric constant greater than 7.5 on a semiconductor substrate;
forming a stack including, from bottom to top, a lower metal layer, a scavenging metal layer, and an upper metal layer, wherein said scavenging metal layer includes a metal (M) for which the Gibbs free energy change of a chemical reaction, in which a silicon atom combines with a metal oxide material including said metal and oxygen to form said metal in elemental form and silicon oxide, is positive, wherein said scavenging metal layer comprises at least aluminum, wherein Gibbs free energy per oxygen atom for formation of an oxide for said metal is equal to or more negative than Gibbs free energy per oxygen atom for formation of an oxide of a first elemental metal within a first metallic compound in said lower metal layer and is equal to or more negative than Gibbs free energy per oxygen atom for formation of an oxide of a second elemental metal within a second metallic compound in said upper metal; and
forming a gate electrode and a gate dielectric, wherein said gate electrode is formed by patterning said stack, and wherein said gate dielectric includes a portion of said high-k dielectric layer.

17. The method of claim 16, wherein said first metallic compound and said second metallic compound are TiN and said scavenging metal layer is an aluminum layer.

18. The method of claim 16, wherein at least one of said first metallic compound and said second metallic compound is a conductive transition metal carbide.

19. The method of claim 18, wherein another of said first metallic compound and said second metallic compound is a conductive transition metal nitride or another conductive transition metal carbide.

20. The method of claim 16, wherein said scavenging metal layer further comprises at least one alkaline earth metal.

* * * * *